(12) United States Patent
Min et al.

(10) Patent No.: US 9,639,121 B2
(45) Date of Patent: May 2, 2017

(54) FOLDABLE DISPLAY

(71) Applicant: Samsung Display Co., Ltd., Yongin, Gyeonggi-Do (KR)

(72) Inventors: Gui-Nam Min, Hwaseong-si (KR); Kyu Young Kim, Suwon-si (KR); Kyu-Taek Lee, Cheonan-si (KR); Jongin Lee, Seoul (KR); Kyung Woo Han, Seoul (KR); Soyeon Han, Seoul (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/160,412

(22) Filed: Jan. 21, 2014

(65) Prior Publication Data

US 2015/0029652 A1    Jan. 29, 2015

(30) Foreign Application Priority Data

Jul. 29, 2013 (KR) .................. 10-2013-0089557

(51) Int. Cl.
*G06F 1/16* (2006.01)
*H05K 1/02* (2006.01)
*H05K 1/03* (2006.01)

(52) U.S. Cl.
CPC .......... *G06F 1/1652* (2013.01); *H05K 1/028* (2013.01); *H05K 1/0278* (2013.01); *H05K 1/038* (2013.01); *B32B 2457/202* (2013.01); *H05K 1/036* (2013.01); *H05K 1/0366* (2013.01); *H05K 2201/029* (2013.01); *H05K 2201/0287* (2013.01); *H05K 2201/051* (2013.01); *H05K 2201/055* (2013.01)

(58) Field of Classification Search
None
See application file for complete search history.

(56) References Cited

U.S. PATENT DOCUMENTS

| | | | | |
|---|---|---|---|---|
| 4,846,230 A | * | 7/1989 | Mock et al. | 139/383 R |
| 5,818,165 A | | 10/1998 | Malhi | |
| 6,086,968 A | * | 7/2000 | Horovitz | 428/36.1 |
| 6,099,745 A | | 8/2000 | McKenney et al. | |
| 8,039,102 B1 | | 10/2011 | Lavature et al. | |
| 2002/0115748 A1 | | 8/2002 | Lee et al. | |
| 2004/0096708 A1 | | 5/2004 | Bottger et al. | |
| 2006/0223398 A1 | | 10/2006 | Citterio et al. | |

(Continued)

FOREIGN PATENT DOCUMENTS

| | | |
|---|---|---|
| JP | 2005-091761 A | 4/2005 |
| JP | 2011-255533 A | 12/2011 |

(Continued)

*Primary Examiner* — Anthony J Frost
(74) *Attorney, Agent, or Firm* — Knobbe Martens Olson & Bear LLP

(57) ABSTRACT

A foldable display is disclosed. In one aspect, the foldable display includes a base substrate including a flexible area and a rigid area disposed at one or more sides of the flexible area. The foldable display also includes an image display device provided on the base substrate. The base substrate includes a matrix and a textile implanted in the matrix. The textile includes a flexible part corresponding to the flexible area and a rigid part corresponding to the rigid area. The rigid part is weaved differently from the flexible part.

25 Claims, 9 Drawing Sheets

(56) References Cited

U.S. PATENT DOCUMENTS

| | | | | |
|---|---|---|---|---|
| 2008/0196783 | A1* | 8/2008 | Van Bruggen et al. | 139/319 |
| 2010/0007942 | A1* | 1/2010 | Oikawa et al. | 359/296 |
| 2010/0051325 | A1* | 3/2010 | Sato et al. | 174/254 |
| 2013/0222998 | A1* | 8/2013 | Cho | G06F 1/1652 |
| | | | | 361/679.27 |

FOREIGN PATENT DOCUMENTS

| | | |
|---|---|---|
| JP | 2012-082554 A | 4/2012 |
| KR | 10-0997447 B1 | 11/2010 |
| KR | 10-2012-0067506 A | 6/2012 |

* cited by examiner

FOLDABLE DISPLAY

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

This U.S. non-provisional patent application claims priority under 35 U.S.C. §119 to Korean Patent Application No. 10-2013-0089557, filed on Jul. 29, 2013, in the Korean Intellectual Property Office, the disclosure of which is hereby incorporated by reference in their entirety.

BACKGROUND

Field

The described technology generally relates to a foldable display.

Description of the Related Technology

Generally, foldable display apparatuses use flat display panels such as liquid crystal display (LCD) panels, field emission display (FED) panels, plasma display panels (PDP), and/or organic light-emitting diode (OLED) display panels. These foldable displays are often used in televisions and/or mobile phones. Recently, the demand for large screens for use in small portable devices such as mobile phones or personal digital assistants (PDA) has increased. Thus, devices using multiple flat display panels connected to each other have been proposed in order to realize a large screen. Consequently, research is being conducted for the manufacturing of display panels including flexible substrates.

A typical foldable display is flexible and foldable, can be easily carried, and has a large screen. A foldable display may be employed in various devices such as portable phones, portable multimedia players (PMP), navigators, ultra mobile personal computers (UMPC), electronic books, electronic newspapers, televisions, and/or monitors.

SUMMARY

One inventive aspect is a foldable display with an improved durability and flexibility.

Another aspect is a foldable display including a base substrate including a flexible area and a rigid area disposed at one or more sides of the flexible area, and an image display device provided on the base substrate. The base substrate includes a matrix, and a textile implanted in the matrix, the textile including a flexible part corresponding to the flexible area and a rigid part corresponding to the rigid area. The rigid part is weaved differently from the flexible part.

The textile may include a weft thread and a warp thread that are formed of yarn. The density of the yarn per unit area of the flexible part may be less than the density of the yarn per unit area of the rigid part. The density per unit area of at least one of the weft thread and the warp thread of the flexible part may be less than the density per unit area of at least one of the weft thread and the warp thread of the rigid part.

The density per unit area of the at least one of the weft thread and the warp thread may be progressively increased from the center of the flexible part toward the edge of the flexible part.

The flexible part may include only one of the weft thread and the warp thread.

The diameter of the at least one of the weft thread and the warp thread of the flexible area may be less than the diameter of the at least one of the weft thread and the warp thread of the rigid area.

The foldable display may further include at least one additional textile substantially overlapping the textile when viewed from a plan view. The additional textile may include a weft thread and a warp thread that are formed of yarn, and the additional textile may be substantially identically weaved in the rigid area and the flexible area. Alternatively, portions of the additional textile respectively disposed in the rigid area and the flexible area may be weaved differently from each other.

The flexible area may include a plurality of flexible areas.

The image display device may include an image display layer and a sealing member sealing the image display layer. The sealing member may include an opposite substrate with the image display layer interposed therebetween. The opposite substrate may include a flexible area and a rigid area disposed at one or more sides of the flexible area in correspondence to the base substrate, and the rigid part and the flexible part of the opposite substrate may be weaved differently from each other.

The image displayer layer may be any one of a liquid crystal display layer, an organic electroluminescence layer, an electrophoresis layer, or an electrowetting layer.

BRIEF DESCRIPTION OF THE DRAWINGS

The features and advantages of the described technology will become more apparent in view of the attached drawings and accompanying detailed description.

DETAILED DESCRIPTION

Figure 1A:
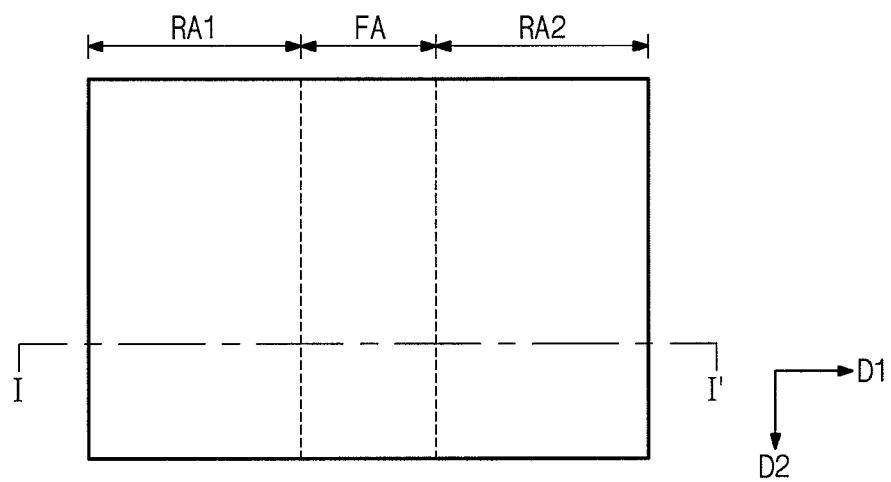
FIG. 1A is a plan view illustrating a foldable display according to an embodiment.

The described technology will now be described more fully hereinafter with reference to the accompanying drawings, in which exemplary embodiments of the described technology are shown. The advantages and features of the described technology and methods of achieving them will be apparent from the following exemplary embodiments that will be described in more detail with reference to the accompanying drawings. It should be noted, however, that the described technology is not limited to the following exemplary embodiments, and may be implemented in various forms. Accordingly, the exemplary embodiments are provided only to disclose the described technology and to convey the described technology to those skilled in the art. In the drawings, embodiments of the described technology are not limited to the specific examples provided herein and elements of the described technology may be exaggerated for clarity.

Additionally, the embodiments of the detailed description will be described in connection with sectional views illustrated as ideal exemplary views of the described technology. Accordingly, the shapes of the exemplary views may be modified according to the manufacturing techniques used in producing the described technology and/or according to allowable errors. Therefore, the embodiments of the described technology are not limited to the specific shapes illustrated in the attached drawings, but may include other shapes that may be created according to manufacturing processes. Areas exemplified in the drawings have general properties, and are used to illustrate specific shapes of elements. Thus, the illustrations should not be construed as limiting of the scope of the described technology.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, the described technology should not be construed as limited to the shapes of regions illustrated herein but includes deviations in the shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of described technology.

Figure 1B:
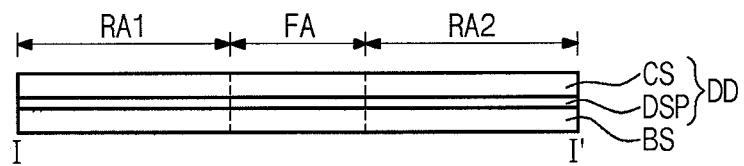
FIG. 1B is a cross-sectional view taken along line I-I' of FIG. 1A illustrating a foldable display according to an embodiment.
Figure 1C:
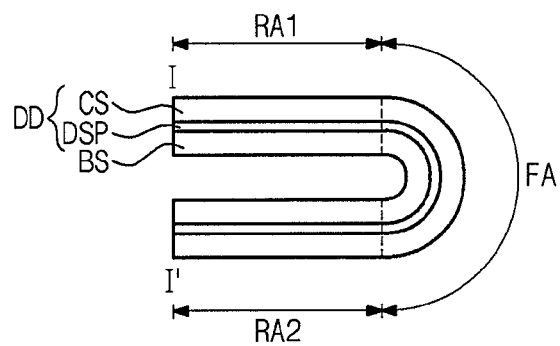
FIG. 1C is a cross-sectional view illustrating the foldable display of FIG. 1A in a folded state.

FIG. 1A is a plan view illustrating a foldable display according to an embodiment of the described technology. FIG. 1B is a cross-sectional view taken along line I-I' of FIG. 1A to illustrate the foldable display. FIG. 1C is a cross-sectional view illustrating the foldable display of FIG. 1A in a folded state.

Referring to FIGS. 1A to 1C, the foldable display displays visual information such as text, video, photographs, or two-dimensional or three-dimensional images. Hereinafter, the visual information displayed by the foldable display is referred to as "an image".

The foldable display may have any one of various different shapes. For example, the foldable display may have a substantially rectangular plate-shape including a first pair of sides substantially parallel to each other and a second pair of sides substantially parallel to each other. According to some embodiments, the foldable display has a substantially square shape, or another shape according to the design requirements thereof. If the foldable display has a substantially rectangular plate-shape, one of the first and second pairs of sides may be longer than the other pair of sides. The foldable display will be described as having a rectangular plate-shape having a pair of long sides and a pair of short sides as an example of the described technology for the purpose of convenience of description. The direction in which the long sides of the foldable display extend is referred to as a first direction D1, and the direction in which the short sides extend is referred to as a second direction D2.

The foldable display includes a base substrate BS and an image display device (or a display panel) DD provided on the base substrate BS.

The base substrate BS can have substantially the same shape as that of the foldable display. According to some embodiments, the base substrate BS has a substantially rectangular shape having a pair of long sides and a pair of short sides. The base substrate BS can be formed of a fiber reinforced plastic substrate. The base substrate BS includes a matrix and a textile implanted into the matrix. The base substrate BS will be described in greater detail later.

The image display device DD includes an image display layer DSP provided on the base substrate BS, and a sealing member facing the base substrate BS with the image display layer DSP interposed therebetween.

The image display layer DSP is a layer capable of displaying an image. The image display layer DSP is not limited to a specific type of layer or configuration. For example, the image display layer DSP may be any one of a liquid crystal display (LCD) layer, an organic electroluminescence layer, an electrophoresis layer, or an electrowetting layer. At least one electrode may be provided to the image display device DD to apply an electric field to the image display layer DSP, thereby controlling whether an image is displayed by the image display layer DSP.

The sealing member is provided to protect the image display layer DSP. The sealing member faces the base substrate BS with the image display layer DSP interposed therebetween and covers the image display layer DSP. According to some embodiments, the sealing member is an opposite substrate CS formed of substantially the same material and having substantially the same shape as the base substrate BS. However, the material and the shape of the sealing member are not limited thereto. According to some embodiments, the sealing member is a thin layer covering the image display layer DSP. In the present embodiment, the sealing member is formed of substantially the same material and have substantially the same shape as the base substrate BS.

At least a portion of the foldable display is flexible. The foldable display includes a flexible area (or a first part) which is flexible and a rigid area (or a second part) which is not flexible or significantly less flexible than the flexible area. The rigid area is disposed at one or more sides of the flexible area. The foldable display may be folded at the flexible area.

According to some embodiments, a first rigid area RA1, the flexible area FA, and a second rigid area RA2 are sequentially arranged in the first direction D1 are illustrated in FIGS. 1A to 1C. The flexible area FA extends along the second direction D2.

In some embodiments, the foldable display is folded about a fold-axis corresponding to the flexible area FA extended in the second direction D2. In other words, the fold-axis of the foldable display is substantially parallel to the second direction D2. After the foldable display is folded, the first and second rigid areas RA1 and RA2 face each other.

As used herein, the term "folded" means that the shape of an element or component is not fixed but is transformed from an initial shape into another shape. In other words, the term "folded" means that an element or component is folded or bent along one or more specific lines as its fold-axis.

Additionally, the term "folded" also means that an element or component is curved, bent or is rolled. Thus, the surfaces of the two rigid areas are substantially parallel to each other and face each other in the present embodiment, but the described technology is not limited thereto. For example, the surfaces of the rigid areas make a predetermined angle (e.g., an acute angle, a right angle, or an obtuse angle) with each other with the flexible area FA therebetween.

Additionally, even though the term "rigid" is used, the rigid areas RA1 and RA2 may be completely hard or may have less flexibility than the flexible area FA. Thus, the rigid areas RA1 and RA2 may be hard without flexibility. Alternatively, the rigid areas RA1 and RA2 may have flexibility but the flexibility of the rigid areas RA1 and RA2 may be less than that of the flexible area FA. Thus, when the foldable display is folded, the foldable display may be folded at the flexible area FA.

For the purpose of convenience of explanation, the first and second rigid areas RA1 and RA2 will be described as having the same area and the flexible area FA will be described as being disposed between the rigid areas RA1 and RA2 as illustrated in FIGS. 1A to 1C. However, the described technology is not limited thereto. For example, the first and second rigid areas RA1 and RA2 may have different areas from each other. Further, the number of the rigid areas is not limited to two. A single rigid area or three or more rigid areas may be provided in the foldable display. In this case, a plurality of rigid areas may be spaced apart from each other with the flexible areas interposed therebetween. In the case that the flexible area FA is located on an outermost edge of the foldable display, the flexible area FA may be folded, bent or rolled.

The flexible area FA is illustrated as extending in the second direction D2 which is the direction in which the short sides of the foldable display extend. However, the described technology is not limited to the above description. According to some embodiments, the flexible area FA may extend the first direction D1 which is the direction in which the long sides of the foldable display extend. According to other embodiments, the flexible area FA may extend in a direction oblique to the first direction D1 or the second direction D2, and the foldable display may be folded on its fold-axis corresponding to the direction in which the flexible area FA extends.

Figure 2:
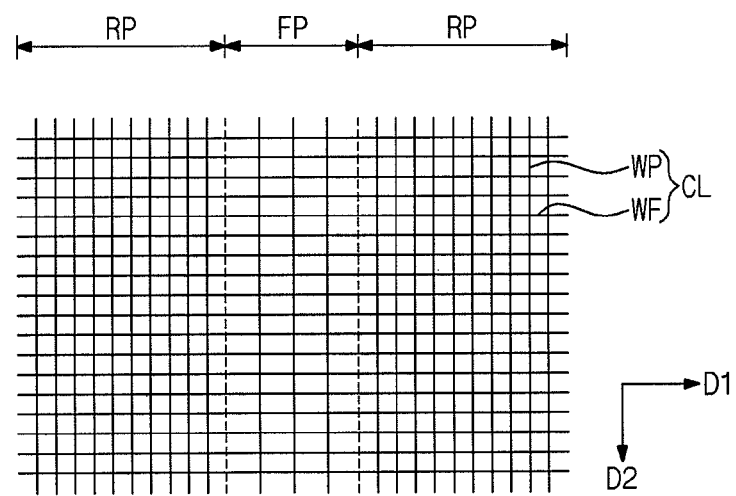
FIG. 2 is a plan view illustrating the textile of a base substrate according to an embodiment.

FIG. 2 is a plan view illustrating a textile of a base substrate according to an embodiment.

Referring to FIG. 2, the textile CL is fabricated to have substantially the same shape as the base substrate when viewed from a plan view. The textile CL is implanted in a matrix (not shown).

The matrix may be located between fibers (or yarns) of the textile CL and on and under the textile CL. The matrix can be formed of a material capable of being implanted with the textile CL. However, the material of the matrix is not limited. For example, the matrix may be formed of at least one of polyethylene terephthalate, unsaturated polyester resin, epoxy resin, silicone rubber, styrene-butadiene resin, butadiene-based resin, isoprene-based resin, chloroprene, neoprene resin, ethylene-propylene-diene terpolymer, styrene-ethylene-butylene-styrene block copolymer, styrene-ethylene-propylene-styrene block copolymer, acrylonitrile-butadiene resin, hydrogenated nitrile-based resin, or plasticized polyvinyl chloride.

The textile CL may include fibers having a high strength. The fibers may be carbon fibers or glass fibers. Thus, the textile CL may include yarn formed with carbon fibers and/or glass fibers. The yarn may be fabricated by twisting the carbon fibers and/or the glass fibers in various manners.

The yarn of the textile CL may be weaved using weft threads WF and warp threads WP. The yarn of the textile CL may be weaved by any one of various methods such as a plain weave, a twill weave, or a satin weave.

The textile CL includes a flexible part FP corresponding to the flexible area of the foldable display and a rigid part RP corresponding to the rigid area of the foldable display. The flexible part FP is a portion of the textile CL corresponding to the flexible area of the foldable display, and the rigid part RP is a portion of the textile CL corresponding to a rigid area of the foldable display. The flexible part FP and the rigid part RP are weaved differently from each other so that the flexible part FP is flexible and the rigid part RP is not flexible. Alternatively, the flexible part FP may be weaved to have a high flexibility and the rigid part RP may be weaved to be less flexible than the flexible part FP.

In order to obtain a difference between the flexibilities of the flexible part FP and the rigid part RP, the density of the fibers per unit area of the flexible part FP may be lower than the density of the fibers per unit area of the rigid part RP. The density per unit area of at least one of the weft thread WF and the warp thread WP of the flexible part FP may be lower than the density per unit area of at least one of the weft thread WF and the warp thread WP of the rigid part RP.

In particular, the threads from among the weft threads WF and the warp threads WP which are substantially parallel to the fold-axis may have a lower density in the flexible part FP. For example, if the flexible area extends in the second direction D2 and the foldable display is folded on its fold-axis substantially parallel to the second direction D2, the density of threads (i.e., the warp threads WP) extending in the second direction D2 may be lower than the density of the weft threads WF in the flexible part FP, as illustrated in FIG. 2. According to some embodiments, the density of the weft threads WF in the flexible part FP is substantially equal to the density of the weft threads WF in the rigid part RP. The weft threads WF of the rigid part RP may not be separate from the weft threads WF of the flexible part FP but may be respectively connected to the weft threads WF of the flexible part FP. Since the warp threads WP of the flexible part FP has a lower density than the warp threads WP of the rigid part RP, the flexible part FP may have a greater flexibility than the rigid part RP.

The fibers may be weaved to manufacture the textile CL, and then the matrix may be coated on the textile CL or the textile CL may be implanted in the matrix. Thereafter, the matrix may be hardened to manufacture the base substrate. Here, the fibers may be processed into a yarn form and then may be weaved to form the textile CL.

The foldable display having the above described structure uses fiber reinforced plastic, thereby increasing the durability of the foldable display. Additionally, since the flexibility of the folded portion of the foldable display is improved, the bending stress or the folding stress applied to the folded portion may be reduced or minimized to reduce errors or defects in the foldable display. In a conventional foldable display, a glass substrate is used as a base substrate. In this case, the durability of the conventional foldable display is excellent but the folding characteristics of the conventional foldable display are not good. Thus, if the conventional foldable display is folded, the folding stress applied to the conventional foldable display may be increased. As a result, it is difficult to manufacture a highly flexible foldable display. Additionally, if a conventional plastic substrate is used as the base substrate, the folding characteristics of the foldable display may be good but the durability of the rigid part may be remarkably reduced.

According to at least one embodiment, since the foldable display uses fiber reinforced plastic, the foldable display has a high durability. Additionally, the density of the textile CL is controlled to reduce the folding stress applied to the folded portion of the foldable display. As a result, the durability and folding characteristics of the foldable display can both be improved.

Additionally, if the sealing member includes the opposite substrate, the opposite substrate may be provided to have substantially the same shape as the base substrate. In other words, the opposite substrate has a flexible area which is flexible and a rigid area disposed at one or more sides of the flexible area corresponding to the rigid areas of the base substrate, and the rigid part and the flexible part of the opposite substrate may be weaved differently from each other.

Figure 3:
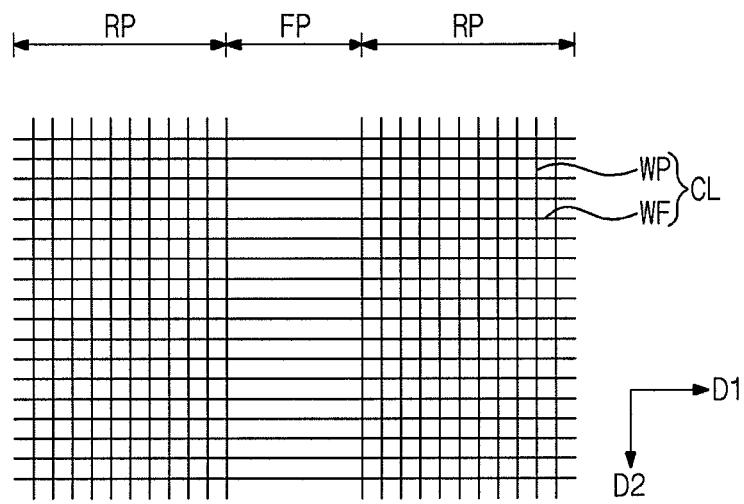
FIG. 3 is a plan view illustrating the textile of a base substrate according to another embodiment.

FIG. 3 is a plan view illustrating the textile of a base substrate according to an embodiment.

Hereinafter, only the differences between the present embodiment and the previously described embodiments will be described in detail and the descriptions of the same or similar elements to those of the previously described embodiments will be omitted or mentioned briefly for the ease and convenience of explanation.

Referring to FIG. 3, in the foldable display, the density of the fiber per unit area of a flexible part FP may be lower than the density of the fiber per unit area of a rigid part RP. Any one of the weft thread WF and the warp thread WP may be removed in the flexible part FP. In other words, the rigid part RP is formed of the weft thread WF and the warp thread WP, but the flexible part FP is formed of only one of the weft thread WF and the warp thread WP.

In particular, the thread parallel to the fold-axis may be removed in the flexible part FP. For example, if the flexible area extends in the second direction D2 and the fold-axis of the foldable display is substantially parallel to the second direction, the thread (i.e., the warp thread WP) extending in the second direction D2 may be removed in the flexible part FP, as illustrated in FIG. 3. In the present embodiment, the density of the weft threads WF of the rigid part RP may be substantially equal to the density of the weft threads WF of the flexible part FP. The weft threads WF of the rigid part RP and the flexible part FP may not be separated from each other but may be respectively connected to each other.

Thus, since the flexible part FP has a lower warp thread WP density than the rigid part RP, the flexible part FP may have a greater flexibility than the rigid part RP.

In the present embodiment, the weft thread WF or the warp thread WP is removed in the flexible part FP of the base substrate, so that the density of the textile CL implanted in the flexible part FP may be reduced by about 50% compared to that of the rigid part RP. In this case, the durability introduced by the implanted textile CL may be maintained and the bending stress applied to the base substrate may be reduced by 30% or more compared to the base substrate including the flexible part FP without a reduced textile density. Thus, when the foldable display is folded, the stress applied to the entire foldable display may be relieved to reduce defects in the foldable display caused by the applied stress.

Figure 4:
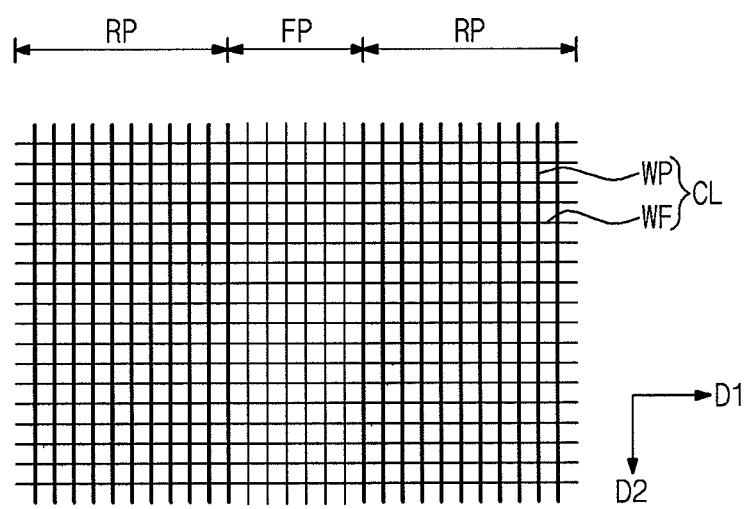
FIG. 4 is a plan view illustrating the textile of a base substrate according to another embodiment.

FIG. 4 is a plan view illustrating the textile of a base substrate according to another embodiment.

In the foldable display, the density of the fiber per unit area of a flexible part FP may be lower than the density of the fiber per unit area of a rigid part RP, and the diameter of one of the weft thread WF and the warp thread WP of the flexible part FP may be different from the diameter of one of the weft thread WF and the warp thread WP of the rigid part RP. According to some embodiments, the diameter of one of the weft thread WF and the warp thread WP of the flexible part FP may be less than the diameter of one of the weft thread WF and the warp thread WP of the rigid part RP.

In more detail, referring to FIG. 4, the diameter of the warp thread WP of the rigid part RP is referred to as a first diameter, and the diameter of the warp thread WP of the flexible part FP is referred to as a second diameter. The first diameter is greater than the second diameter. Here, the diameter of the weft thread WF of the rigid part RP may be substantially equal to the diameter of the weft thread WF of the flexible part FP. Because the diameter of the warp thread WP of the flexible part FP is less than that of the warp thread WP of the rigid part RP, the flexibility of the flexible part FP is greater than the flexibility of the rigid part RP, so that the bending stress is reduced when the foldable display is folded.

According to some embodiments, the flexible area extending in the second direction D2 and the fold-axis substantially parallel to the second direction D2 are illustrated as an example, so that the diameter of the warp thread WP may be controlled. However, the described technology is not limited thereto. In other words, the diameter of a thread extending substantially parallel to the fold-axis of the flexible part FP may be formed to be smaller than the diameter of the corresponding thread of the rigid part RP. The weft threads WF of the rigid part RP and the flexible part FP may not be separated from each other but may be respectively connected to each other.

If the flexible area extends in the first direction D1 and the foldable display is folded on a fold-axis substantially parallel to the first direction D1, the weft threads WF of the rigid and flexible parts RP and FP may be different from each other.

Figure 5:
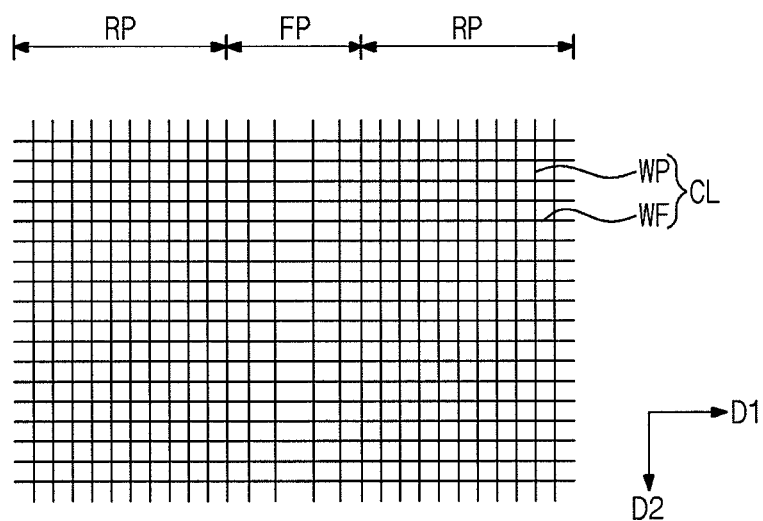
FIG. 5 is a plan view illustrating the textile of a base substrate according to yet another embodiment.

FIG. 5 is a plan view illustrating the textile of a base substrate according to yet another embodiment.

In the foldable display, the density of the fiber per unit area of a flexible part FP may be lower than the density of the fiber per unit area of a rigid part RP, and the flexible part FP may include portions having different fiber densities from each other. In the flexible part FP, the density per unit area of at least one of the weft thread WF and the warp thread WP may be progressively increased from the center of the flexible part FP toward one or both edges of the flexible part FP. In FIG. 5, the density per unit area of the warp thread WP is progressively increased from the center toward the edges of the flexible part FP.

According to some embodiments, the flexible part FP has portions having different densities per unit area for at least one of the weft thread WF and the warp thread WP in order to control the folding degree in the flexible part FP. The density of the at least one of the weft thread WF and the warp thread WP may be controlled to control the folding position and the folding degree of the foldable display.

Figure 6:
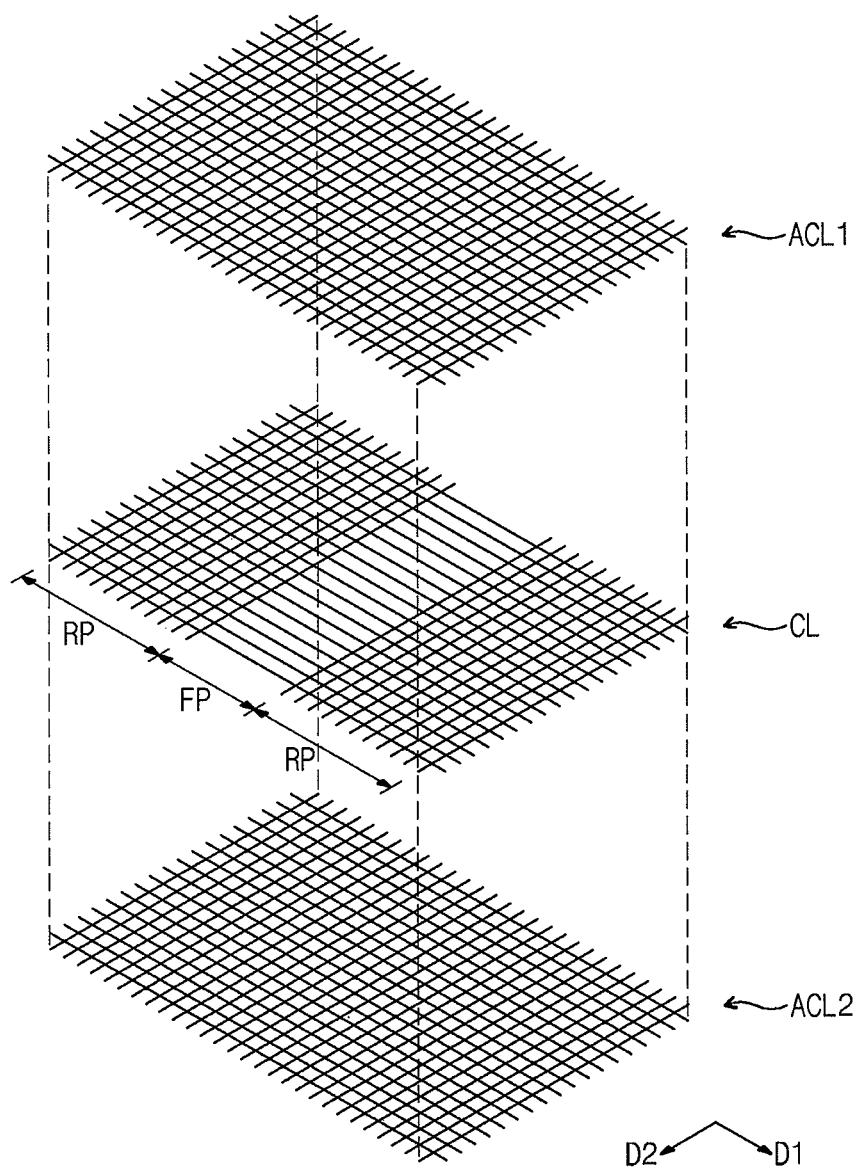
FIG. 6 is a perspective view illustrating the textiles of a base substrate according to another embodiment.

FIG. 6 is a perspective view illustrating the textiles of a base substrate according to an embodiment.

In the foldable displays according to the previous embodiments, the base substrate has a single-layered structure having a single textile implanted in the matrix. In the foldable display according to the present embodiment, the base substrate may have a multi-layered structure including a stack of single-layered structures. For example, an additional textile may be further included in the matrix including the textile CL. The textile CL may be a textile CL according to one of the previous embodiments. In the present embodiment, the textile CL of the embodiment of FIG. 3 is illustrated as an example.

A single additional textile may be provided on or under the textile CL. Alternatively, a plurality of additional textiles may be respectively provided on and under the textile CL. In this case, the textile CL may be disposed between the additional textiles. First and second additional textiles ACL1 and ACL2 are respectively disposed on and under the textile CL in the embodiment illustrated in FIG. 6.

Referring to FIG. 6, the additional textiles ACL1 and ACL2 are manufactured to have substantially the same shape as the base substrate when viewed from a plan view. Thus, the additional textiles ACL1 and ACL2 substantially overlap the textile CL when viewed from a plan view. The additional textiles ACL1 and ACL2 have substantially the same size as the textile CL.

Each of the additional textiles ACL1 and ACL2 may be formed of at least one of various fibers. For example, each of the additional textiles ACL1 and ACL2 may be formed of at least one of carbon fiber or glass fiber. The additional textiles ACL1 and ACL2 may include yard formed using the carbon fiber and/or the glass fiber. The yarn may be manufactured by twisting the carbon or glass fiber by at least one of various methods.

The additional textiles ACL1 and ACL2 may be weaved using the yarn as a weft thread and a warp thread. The weaving method of the additional textiles ACL1 and ACL2 may be at least one of various methods such as a plain weave, a twill weave, or a satin weave.

The additional textiles ACL1 and ACL2 may be substantially identically weaved over the entire surfaces thereof. For example, the fiber density of a portion of each additional textile ACL1 or ACL2 corresponding to the rigid area may be substantially equal to the fiber density of another portion corresponding to the flexible area of each additional textile ACL1 or ACL2. However, the described technology is not limited thereto. For example, the portion of each additional textile ACL1 or ACL2 corresponding to the rigid area may also be weaved differently from the portion of the each additional textile ACL1 or ACL2 corresponding to the flexible area.

Since the additional textiles ACL1 and ACL2 are added into the base substrate of the foldable display, the durability of the base substrate is increased.

Figure 7:
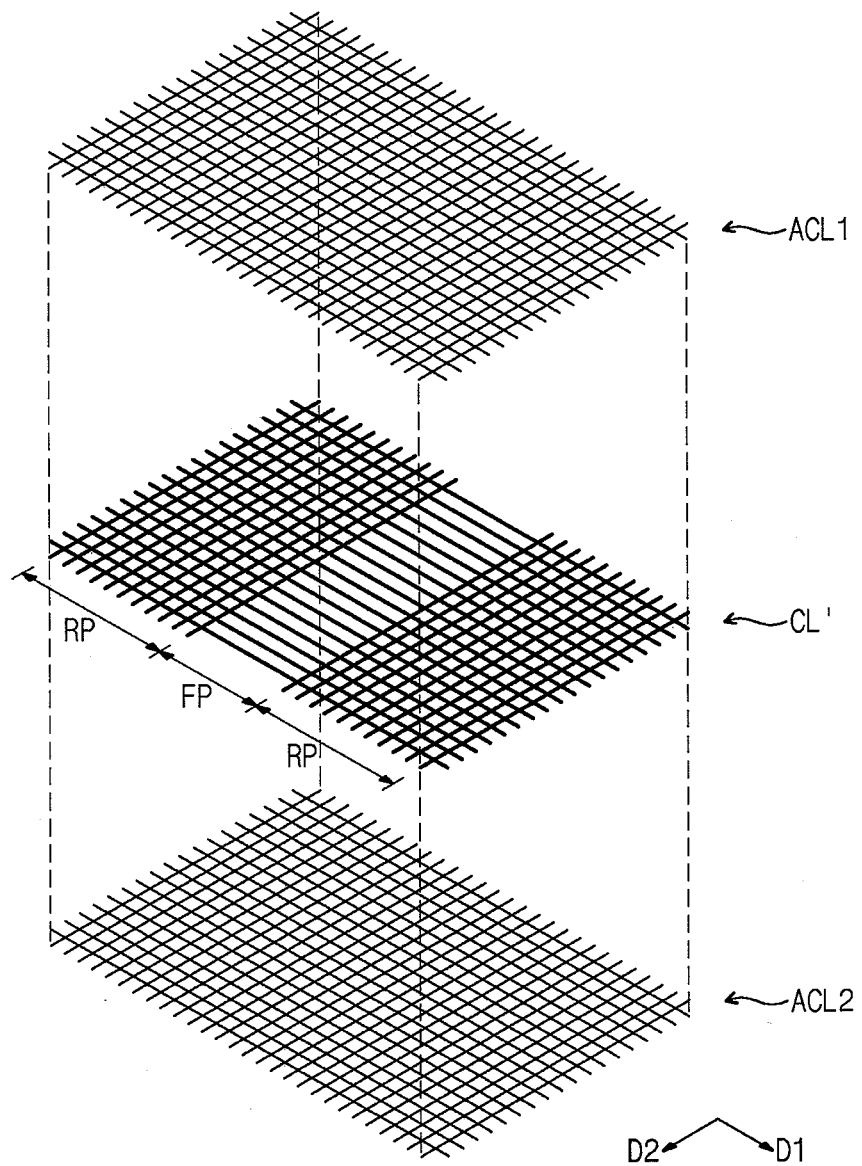
FIG. 7 is a perspective view illustrating the textiles of a base substrate according to another embodiment.

FIG. 7 is a perspective view illustrating the textiles of a base substrate according to another embodiment.

According to some embodiments, the base substrate has a multi-layered structure and the diameter of the thread of a textile CL' may be configured to be different from the diameter of the threads of additional textiles. For example, if the diameter of at least one of a weft thread and a warp thread of the textile CL' is referred to as a first diameter and the diameter of at least one of a weft thread and a warp thread of the additional textiles ACL1 and ACL2 is referred to as a second diameter, the first diameter may be greater than the second diameter. For example, the first diameter may be in the range of about 50 µm to about 100 µm, and the second diameter may be in the range of about 10 µm to about 30 µm.

In the present embodiment, the diameters of each of the weft thread and the warp thread of the textile CL' are greater than the diameters of each of the weft thread and the warp thread of the additional textiles ACL1 and ACL2. The textile CL' may be a textile according to one of the previous embodiments. In the present embodiment, the textile CL' is weaved to have the same shape as the textile illustrated in FIG. 3, and the diameters of the weft thread and the warp thread of the textile CL' are greater than those of the additional textiles ACL1 and ACL2.

Figure 8:
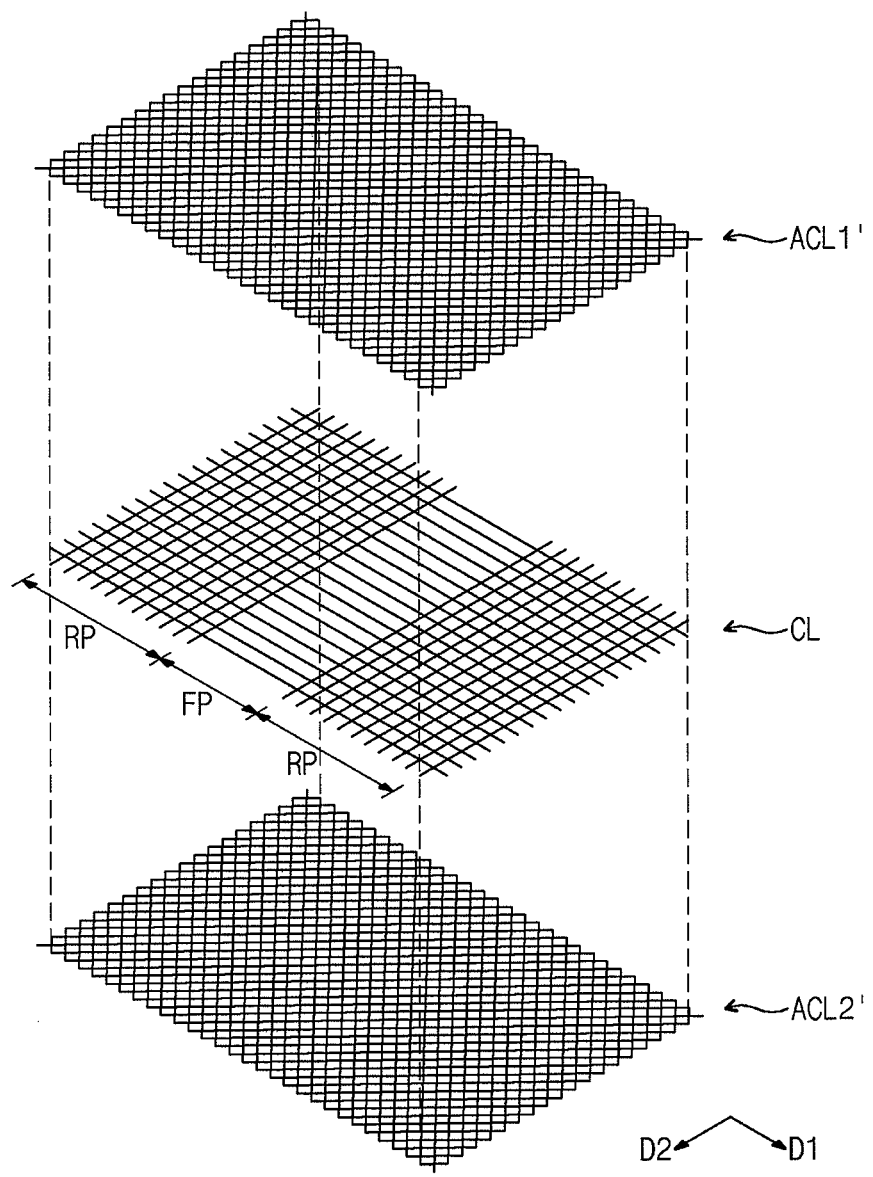
FIG. 8 is a perspective view illustrating the textiles of a base substrate according to another embodiment.

FIG. 8 is a perspective view illustrating the textiles of a base substrate according to yet another embodiment.

Referring to FIG. 8, the base substrate has a multi-layered base substrate and the weaving direction of the textile CL may be configured to be different from the weaving directions of additional textiles ACL1' and ACL2'. For example, the directions in which the weft thread and/or the warp thread of the textile CL extend may be different from the directions in which the weft and/or warp threads of the additional textiles ACL1' and ACL2' extend.

In the present embodiment, the weft thread and the warp thread of the textile CL respectively extend in the directions of the long side and the short side (i.e., the first direction D1 and the second direction D2) of the foldable display. On the contrary, the weft threads and the warp threads of the additional textiles ACL1' and ACL2' may extend in directions having an angle with respect to the first direction D1 or the second direction D2.

As described above, the densities, the diameters, and/or the weaving directions of the textile and the additional textiles may be controlled to satisfy the flexibility and durability requirements of the foldable display having a multi-layered base substrate.

Figure 9A:
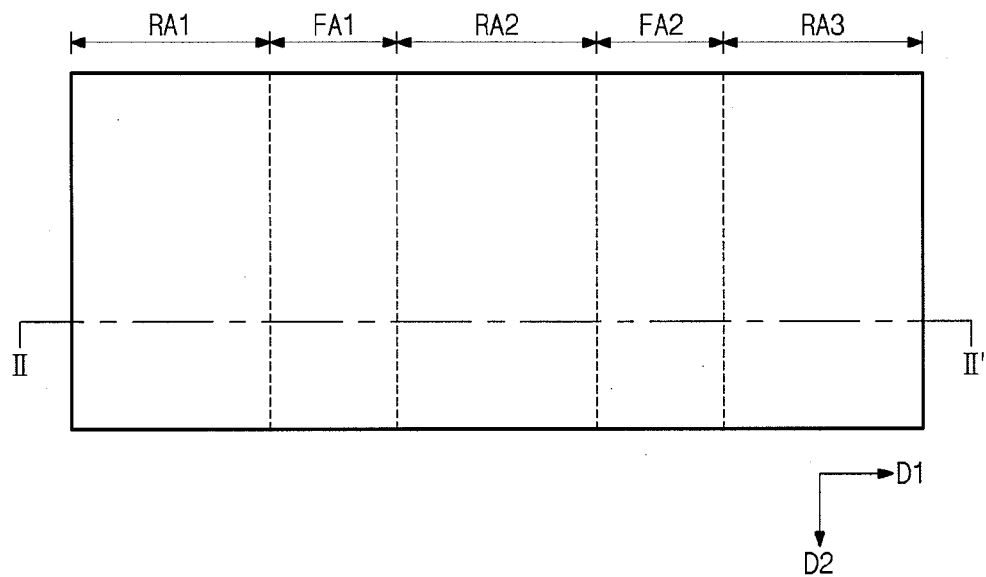
FIG. 9A is a plan view illustrating a foldable display according to an embodiment.
Figure 9B:
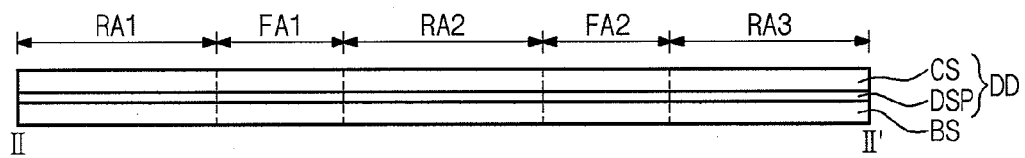
FIG. 9B is a cross-sectional view taken along line I-I' of FIG. 9A to illustrate the foldable display.
Figure 9C:
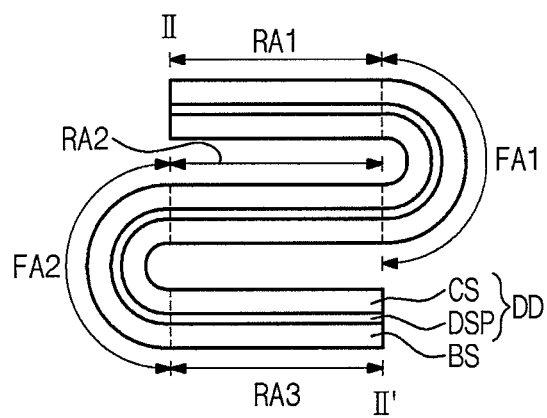
FIG. 9C is a cross-sectional view illustrating the foldable display of FIG. 9A in a folded state.

FIG. 9A is a plan view illustrating a foldable display according to an embodiment. FIG. 9B is a cross-sectional view taken along line I-I' of FIG. 9A to illustrate the foldable display. FIG. 9C is a cross-sectional view illustrating the foldable display of FIG. 9A in a folded state.

Referring to FIGS. 9A to 9C, the foldable display may include a plurality of flexible areas and a plurality of rigid areas.

In the present embodiment, for example, a first rigid area RA1, a first flexible area FA1, a second rigid area RA2, a second flexible area FA2, and a third rigid area RA3 are sequentially arranged in a first direction D1. Each of the first and second flexible areas FA1 and FA2 extends in a second direction D2.

The foldable display may be folded at the first flexible area FA1 and at the second flexible area FA2. According to some embodiments, the foldable display are folded two times along its fold-axes extending in the second direction D2. For example, the foldable display can be folded at both the first flexible area FA1 and the second flexible area FA2. In the drawings, the foldable display is illustrated as folded so that the second rigid area RA2 is located between the first rigid area RA1 and the third rigid area RA3. However, the described technology is not limited thereto. For example, the foldable display may be folded so that the first rigid area RA1 may be located between the second rigid area RA2 and the third rigid area RA3.

Directions of the fold-axes of the foldable display are not limited to specific directions. The directions of the fold-axes of the foldable display may be varied depending on the number of the flexible areas and the direction in which the flexible areas extend. According to some embodiments, a plurality of flexible areas are provided and the flexible areas include a flexible area extending in the first direction D1 and a flexible area extending in the second direction D2. In this case, the foldable display may be folded using the flexible area extending the first direction D1 as its fold-axis and may also be folded using the flexible area extending the second direction D2 as its fold-axis.

According to at least one embodiment, the bending stress of the base substrate is remarkably reduced when compared with a conventional base substrate.

In order to measure the bending stresses of a conventional base substrate and the base substrate according to the described technology, a number of base substrates were manufactured using a conventional method and according to embodiments of the described technology.

A textile weaved with a glass fiber of about 80 μm was implanted in a matrix of polyethylene terephthalate, thereby forming a conventional base substrate. The conventional base substrate was formed to have a thickness of about 130 μm. The conventional base substrate was formed to have the same weave density throughout the entire substrate. The base substrate according to the described technology was manufactured by implanting a textile into a matrix of polyethylene terephthalate. Unlike the conventional base substrate, weft threads were removed from the flexible area of the base substrate. The weave method and the other conditions of the conventional base substrate were the same as those of the base substrate according to the described technology.

After each base substrate was folded about ten times under the conditions of a speed of about 20 mm/sec and to a curvature radius of about 3, the magnitude of a restoring force of each base substrate was measured to obtain the bending stress of each base substrate.

As a result, the bending stress of the conventional base substrate was about 0.45N, and the bending stress of the base substrate according to the described technology was about 0.35N. The bending stress of the base substrate according to the described technology is substantially the same as the stiffness of a polyethylene terephthalate substrate having a thickness of about 80 μm. Thus, the base substrate according to the described technology has a remarkably lower bending stress than the conventional base substrate.

The foldable displays according to the described technology may be used in various applications or products. For example, the foldable displays according to the described technology may be used in portable devices, smart phones, electronic books, laptop computers, notebook computers, tablet computers, personal computers, and/or billboards. However, the described technology is not limited thereto.

According to at least one embodiment, the foldable display has an improved flexibility and durability.

While the described technology have been described with reference to exemplary embodiments, it will be apparent to those skilled in the art that various changes and modifications may be made without departing from the spirit or scope of the described technology. Therefore, it should be understood that the described embodiments are not limiting, but illustrative. Thus, the scope of the described technology is to be determined by the broadest permissible interpretation of the following claims and their equivalents, and shall not be restricted or limited by the foregoing description.

What is claimed is:
1. A foldable display, comprising:
   a display panel including a panel flexible area and a panel rigid area, wherein the panel rigid area is located at one or more sides of the flexible area; and
   a base substrate located on the display panel, wherein the base substrate includes a substrate flexible area corresponding to the panel flexible area and a substrate rigid area corresponding to the panel rigid area,
   wherein the base substrate comprises:
      a matrix, and
      a textile embedded in the matrix, the textile including:
         i) a flexible part corresponding to the substrate flexible area and ii) a rigid part corresponding to the substrate rigid area,
   wherein the rigid part is weaved differently from the flexible part, and
   wherein the thickness of the rigid part is the same as that of the flexible part,
   wherein the textile includes a weft thread and a warp thread, wherein each of the weft and warp threads is formed of yarn, and wherein the rigid part includes both the weft and warp threads and the flexible part includes only one of the weft and warp threads.

2. The foldable display of claim 1, wherein the density of the yarn of the flexible part is less than the density of the yarn of the rigid part.

3. The foldable display of claim 1, wherein the density of at least one of the weft thread or the warp thread of the flexible part is less than the density of the at least one of the weft thread or the warp thread of the rigid part.

4. The foldable display of claim 3, wherein the density of the at least one of the weft thread or the warp thread progressively increases from the center of the flexible part towards the rigid part.

5. The foldable display of claim 3, wherein the diameter of the at least one of the weft thread or the warp thread of the flexible area is less than the diameter of the at least one of the weft thread or the warp thread of the rigid area.

6. The foldable display of claim 1, wherein the yarn comprises at least one of carbon fiber or glass fiber.

7. The foldable display of claim 1, further comprising at least one additional textile substantially overlapping the textile on a plan view.

8. The foldable display of claim 7, wherein the additional textile includes a weft thread and a warp thread, wherein each of the weft and warp threads of the additional textile is formed of yarn, and wherein the additional textile is weaved in substantially the same way in the rigid and flexible areas.

9. The foldable display of claim 8, wherein the diameter of at least one of the weft thread or the warp thread of the additional textile is less than the diameter of at least one of the weft thread or the warp thread of the textile.

10. The foldable display of claim 8, wherein at least one of the weft thread or the warp thread of the additional textile extend in a first direction, and wherein at least one of the weft thread or the warp thread of the textile extend in a second direction crossing the first direction.

11. The foldable display of claim 8, wherein the additional textile comprises first and second additional textiles and wherein the first and second additional textiles face each other with the textile interposed therebetween.

12. The foldable display of claim 1, wherein the flexible area comprises a plurality of flexible areas.

13. The foldable display of claim 1, wherein the textile includes a weft thread and a warp thread, wherein each of the weft and warp threads is formed of yarn, wherein the base substrate includes a pair of long sides extending in a first direction and a pair of short sides extending in a second direction, and wherein the weft thread extends in the first direction and the warp thread extends in the second direction.

14. The foldable display of claim 13, wherein the flexible area extends in the second direction and wherein the flexible part includes only the weft thread.

15. The foldable display of claim 1, wherein the display panel comprises an image display layer and a sealing member sealing the image display layer.

16. The foldable display of claim 15, wherein the image displayer layer is any one of a liquid crystal display layer, an organic electroluminescence layer, an electrophoresis layer, or an electrowetting layer.

17. The foldable display of claim 15, wherein the sealing member includes an opposite substrate and wherein the image display layer is interposed between the opposite substrate and the base substrate.

18. The foldable display of claim 17, wherein the opposite substrate comprises:
a flexible area and a rigid area, wherein the rigid area is located at one or more sides of the flexible area corresponding to the rigid area of the base substrate; and
a textile including: i) a flexible part corresponding to the flexible area and ii) a rigid part corresponding to the rigid area,
wherein the rigid part and the flexible part of the opposite substrate are weaved differently from each other.

19. The foldable display of claim 1, wherein the rigid area and the rigid part are respectively significantly less flexible than the flexible area and the flexible part.

20. A foldable display, comprising:
a display panel including a panel flexible area and a panel rigid area, wherein the panel rigid area is located at one or more sides of the flexible area; and
a base substrate located on the display panel, wherein the base substrate includes a substrate flexible area corresponding to the panel flexible area and a substrate rigid area corresponding to the panel rigid area,
wherein the base substrate comprises:
a matrix, and
a textile embedded into the matrix, the textile including a first part corresponding to the substrate flexible are and a second part corresponding to the substrate rigid area, wherein the first part is significantly more flexible than the second part,
wherein the second part is located at one or more sides of the first part,
wherein the density of the first part is less than the density of the second part, and
wherein the thickness of the second part is the same as that of the first part,
wherein the textile includes a weft thread and a warp thread and wherein each of the weft and warp threads is formed of yarn, and wherein the second part includes both the weft and warp threads and the first part includes only one of the weft and warp threads.

21. The foldable display of claim 20, wherein the base substrate includes a flexible area and a rigid area respectively corresponding to the first and second parts, and wherein the rigid area is significantly less flexible than the flexible area.

22. The foldable display of claim 20, wherein the density of at least one of the weft thread or the warp thread of the textile is less than the density of the at least one of the weft thread or the warp thread of the rigid part.

23. The foldable display of claim 1, wherein the rigid part and the flexible part are formed of the same layers that are continuously formed in a direction parallel to the base substrate.

24. The foldable display of claim 1, wherein the weft and warp threads are linear in both the flexible and rigid parts.

25. The foldable display of claim 1, wherein the flexible part comprises a plurality of flexible portions, wherein the rigid part comprises a plurality of rigid portions, and wherein the flexible portions and the rigid portions are alternatively formed.

* * * * *